United States Patent [19]

Seki et al.

[11] 4,336,504
[45] Jun. 22, 1982

[54] PUSH-PULL OUTPUT CIRCUIT

[75] Inventors: Kunio Seki, Tokyo; Norihisa Katoh, Higashimurayama, both of Japan

[73] Assignees: Hitachi, Ltd.; Hitachi Ome Electronic Co., Ltd., both of Tokyo, Japan

[21] Appl. No.: 142,128

[22] Filed: Apr. 21, 1980

[30] Foreign Application Priority Data

Apr. 25, 1979 [JP] Japan ................................. 54-50273

[51] Int. Cl.³ .............................................. H03F 3/26
[52] U.S. Cl. .................................. 330/274; 330/268; 330/270
[58] Field of Search ............... 330/273, 270, 267, 265, 330/271, 262, 274, 268

[56] References Cited

U.S. PATENT DOCUMENTS 4,145,666  3/1979  Seki ....................................... 33/271

Primary Examiner—James B. Mullins
Assistant Examiner—Gene Wan
Attorney, Agent, or Firm—Craig and Antonelli

[57] ABSTRACT

A push-pull output circuit which is capable of producing a relatively-high maximum output voltage without the use of a bootstrap capacitor provides positive and negative half cycle output circuits which are constructed as inverted Darlington output circuits to which current mirror circuits and level shifting elements are coupled. As a result, the distortion factor of an open loop characteristic in the push-pull output circuit is improved.

7 Claims, 3 Drawing Figures

PUSH-PULL OUTPUT CIRCUIT

The present invention relates to a push-pull output circuit.

A complementary push-pull output circuit which can be constructed in a monolithic semiconductor integrated circuit has been known, such as by U.S. Pat. No. 3,197,710. In the known complementary push-pull output circuit, NPN transistors are constructed in the configuration of a so-called vertical transistor structure while PNP transistors are constructed in the configuration of a so-called lateral transistor structure. In this type of known complementary push-pull output circuit, a first group of transistors comprising a pair of vertical NPN transistors connected in Darlington configuration are arranged between a first operating potential point and an output terminal while a second group of transistors comprising a lateral PNP transistor and two other vertical NPN transistors connected in Darlington connection are arranged between the output terminal and a second operating potential point.

A difference between a positive half cycle output gain and a negative half cycle output gain which is due to a difference between a current amplification factor of the first group of transistors and a current amplification factor of the second group of transistors causes a relatively large distortion factor in the output of the complementary push-pull output circuit. In DE-OS No. 22 33 260, in order to reduce the distortion factor of the complementary push-pull output circuit, the base-emitter junction of another lateral PNP transistor is connected in forward direction between the base and the emitter of the lateral PNP transistor of the second group of transistors, the collector and the base of said other lateral PNP transistor are connected together.

By forwardly connecting the base-emitter junction of the second transistor between the base and the emitter of the first transistor and by connecting together the collector and the base of the second transistor, the first and second transistors constitute a so-called constant current circuit. The constant current circuit (current mirror circuit) has been known, such as by U.S. Pat. No. 3,391,311 or 1969 IEEE International Solid-State Circuits Conference DIGEST OF TECHNICAL PAPERS, February 1969, pages 16–17. As is well known in the art, the ratio of an input current to an output current in the constant current circuit is equal to a ratio of current coefficients (emitter areas) of the two transistors forming the constant current circuit.

Thus, in the complementary push-pull output citcuit shown in the DE-OS No. 22 33 260, the ratio of the input current to the output current in the constant current circuit will be 1 (unity) when the ratio of the current coefficients (emitter areas) of the two lateral PNP transistors of the second group of transistors forming the constant current circuit is selected to 1 (unity). Thus, since the positive half cycle output gain and the negative half cycle output gain of the complementary push-pull output circuit are determined by the current amplification factor of the pair of Darlington-connected vertical NPN transistors of the first group of transistors and the current amplification factor of the pair of Darlington-connected vertical transistors of the second group of transistors, respectively, the difference between the positive half cycle output gain and the negative half cycle output gain will be of negligible magnitude.

However, a maximum output voltage $v_{OUT(max)}$ obtainable from the output terminal of the complementary push-pull output circuit shown in the DE-OS No. 22 33 260 is given by the following formula:

$$v_{OUT(max)} = V_{CC} - 2V_{BE} \qquad (1)$$

where $V_{CC}$ is a power supply voltage and $V_{BE}$ is the base-emitter voltage of each of the pair of Darlington-connected vertical NPN transistors of the first group of transistors.

Accordingly, the maximum output voltage of the complementary push-pull output circuit shown in the DE-OS No. 22 33 260 has a relatively large residual voltage of 2 $V_{BE}$. In order to obtain a higher output voltage by establishing a small value of residual voltage, it has been proposed to connect a bootstrap capacitor between the output terminal of the complementary push-pull output circuit and the pair of Darlington-connected vertical NPN transistors of the first group of transistors. Through a positive feedback via the bootstrap capacitor, the base potential of the vertical NPN transistors of the first group of transistors is driven to a higher level than the power supply voltage $V_{CC}$ so that the vertical NPN transistors of the first group of transistors are driven into their saturation regions. Thus, a maximum output voltage $v'_{OUT(max)}$ obtainable from the complementary push-pull output circuit which uses the bootstrap capacitor is given by the following formula:

$$v'_{OUT(max)} = V_{CC} - V_{CE(sat)} \qquad (2)$$

where $V_{CC}$ is the power supply voltage and $V_{CE(sat)}$ is the collector-emitter saturation voltage of each of the vertical NPN transistors of the first group of transistors.

Accordingly, when the bootstrap capacitor is used in the complementary push-pull output circuit shown in the DE-OS No. 22 33 260, the maximum output voltage $v'_{OUT(max)}$ has a relatively small residual voltage of $V_{CE(sat)}$. However, the bootstrap capacitor is expensive and it must be a discrete element because of difficulty in forming it in a monolithic semiconductor integrated circuit. As a result, the cost of the integrated circuit increases because the integrated circuit needs lead terminals for coupling to the discrete bootstrap capacitor element.

On the other hand, a push-pull circuit for producing a maximum output voltage having a relatively small residual voltage without using the bootstrap circuit has been known, such as by Japanese Patent Application Laid-Open No. 35351/78.

The circuit shown in the laid-open Japanese Application is a push-pull output circuit including inverted Darlington-connected transistors $Q_1$, $Q_3$ and $Q_2$, $Q_4$ as output circuits, as shown in FIG. 2.

A maximum output voltage $v''_{OUT(max)}$ obtainable from the push-pull output circuit shown in FIG. 2 is given by the following formula:

$$v''_{OUT(max)} = V_{CC} - V_{BEQ3} - V_{CE(sat)Q1} \qquad (3)$$
$$\approx V_{CC} - V_{BEQ3}$$

where $V_{CC}$ is the power supply voltage, $V_{BEQ3}$ is a base-emitter voltage of an NPN transistor $Q_3$ and $V_{CE(sat)Q1}$ is a collector-emitter saturation voltage of a PNP transistor $Q_1$.

Thus, the maximum output voltage $v''_{OUT(max)}$ obtainable from the push-pull circuit shown in FIG. 2 is relatively high although it does not use the bootstrap capacitor.

It has been found by the inventors of the present invention that the distortion factor of the circuit shown in FIG. 2 is deteriorated due to second order harmonics when the amount of negative feedback decreases in a high frequency range.

The inventors studied the causes therefore and found the following facts:

The circuit shown in FIG. 2 includes the PNP transistors $Q_1$ and $Q_2$ as driving transistors and the NPN transistors $Q_3$ and $Q_4$ as the output transistors but the transistor $Q_1$ for producing a positive half cycle output constitutes a current mirror circuit merely with a transistor $Q_9'$. Accordingly, when the positive half cycle output is produced, an input NPN transistor $Q_8'$ of the current mirror circuit acts as an essential driving transistor.

The gain $(v_o/v_i)$up when the positive half cycle output transistor $Q_3$ is conductive is given by the following formula:

$$(v_o/v_i)\text{up} = h_{feQ8'} \cdot h_{feQ3} \cdot S_{EQ1} \cdot R_L / h_{ibQ5} \cdot S_{EQ9'} \quad (4)$$

where $S_{EQ1}$ and $S_{EQ9'}$ are emitter sizes (e.g. emitter peripheral lengths) of the transistors $Q_1$ and $Q_9'$, respectively. On the other hand, the gain $(v_o/v_i)_{DW}$ when the negative half cycle output transistor $Q_4$ is conductive is given by the following formula:

$$(v_o/v_i)_{DW} = h_{feQ2} \cdot h_{feQ4} \cdot R_L / h_{ibQ5} \quad (5)$$

In the above formulas (4) and (5), it is easy to make the current amplification factors $h_{feQ3}$ and $h_{feQ4}$ of the transistors $Q_3$ and $Q_4$ approximately equal because they are both NPN transistors, but making the current amplification factors $h_{feQ8'}$ and $h_{feQ2}$ of the NPN transistor $Q_8'$ and the PNP transistor $Q_2$ approximately equal is difficult even when the transistors are discrete devices and it is almost impossible when the transistors are constructed in a monolithic integrated circuit.

In the monolithic integrated circuit, as is well known, the NPN transistors are constructed in the vertical transistor structure while the PNP transistors are constructed in the lateral transistor structure. Thus, due to various dispersions in the manufacturing process of the monolithic integrated circuit, the current amplification factors of the vertical NPN transistors range between 50 and 200 while the current amplification factors of the lateral PNP transistors range between 30 and 200. In the manufacture of the monolithic IC, process conditions are established such that the current amplification factors of the vertical NPN transistors have values in a predetermined range and the values of the current amplification factors of the lateral PNP transistors are not usually considered strictly in establishing the process conditions.

While it may be possible to control the ratio of the gains for the positive and negative half cycle outputs by the gain of the current mirror circuit comprising PNP transistors $Q_1$ and $Q_9'$ (which corresponds to the ratio of emitter areas $S_{EQ1}/S_{EQ9'}$), this is not a practical expedient because of dispersion of the device characteristics.

As a result, due to the difference between the gains for the positive and negative half cycle outputs, the second harmonics appears, which extremely deteriorates the distortion factor especially when the amount of negative feedback decreases in the high frequency range.

It is an object of the present invention to provide a push-pull output circuit which is capable of producing a relatively high maximum output voltage without using a bootstrap capacitor and which improves the distortion factor which would otherwise be deteriorated by the secondary harmonics in an open loop characteristics.

In accordance with a basic construction of the present invention, the positive and negative half cycle output circuits are both constructed essentially as inverted Darlington output circuits to which current mirror circuits and level shifting elements are coupled.

The present invention will now be described in detail with reference to the accompanying drawings, in which.

Figure 1:
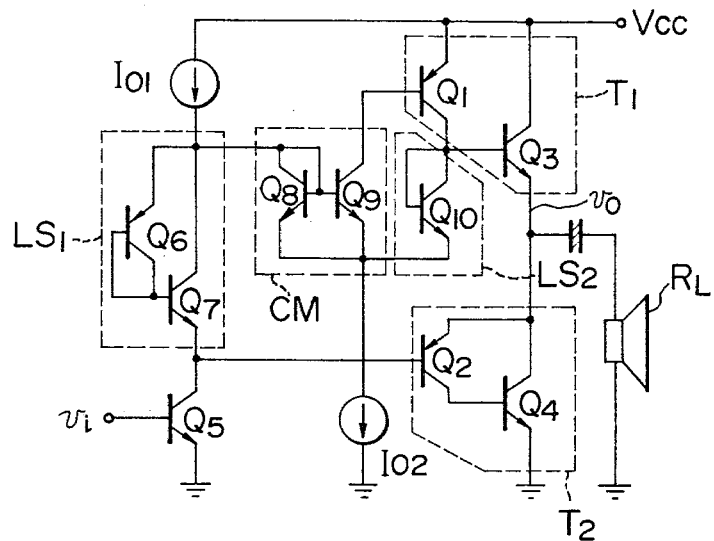
FIG. 1 shows a circuit diagram of one embodiment of the present invention.
Figure 2:
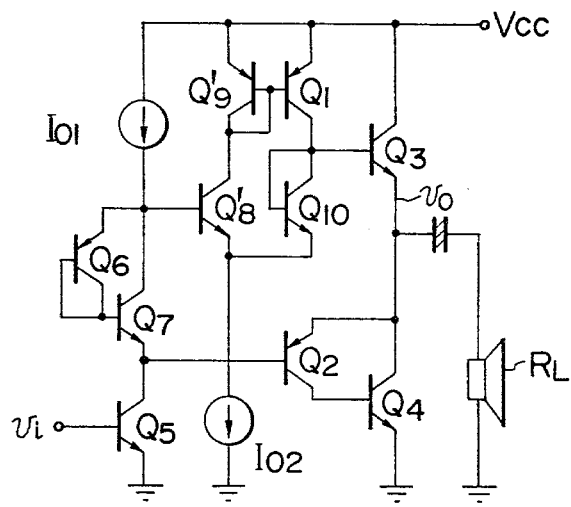
FIG. 2 shows a circuit diagram of an example of prior art circuit.

In FIG. 1, a first group of transistors $T_1$ comprising a PNP transistor $Q_1$ as a driving transistor and an NPN transistor $Q_3$ Darlington-connected thereto as an output transistor constitutes a class B amplification output circuit for producing a positive half cycle output while a second group of transistors $T_2$ comprising a PNP transistor $Q_2$ as a driving transistor and an NPN transistor $Q_4$ Darlington-connected thereto as an output transistor constitutes a class B amplification output circuit for producing a negative half cycle output.

The first transistor group $T_1$ and the second transistor group $T_2$ are connected in series across a power supply voltage $V_{CC}$ and ground potential to form a push-pull output circuit.

Directly applied to the base of the driving transistor $Q_2$ of the negative half cycle output transistor group is a collector output of an amplifying transistor $Q_5$ which produces a class A amplified output signal which is an input signal to the push-pull output circuit.

On the other hand, applied to the base of the driving transistor $Q_1$ of the positive half wave output transistor group, through a current mirror circuit CM comprising NPN transistors $Q_8$ and $Q_9$, is an inverted version of the collector output of the amplifying transistor $Q_5$ which forms a class A amplified output signal, which collector output is further level-shifted by a first level shifting circuit $LS_1$ for reducing crossover distortion.

In order to bias the output transistor $Q_3$, a second level shifting circuit $LS_2$ comprising a forward-biased diode (or diode-connected transistor) $Q_{10}$ is inserted between the base of the output transistor $Q_3$ and the commonly connected emitters of the transistors $Q_8$ and $Q_9$ forming the current mirror circuit CM, and a constant current circuit $I_{02}$ is connected to the commonly connected emitters of the transistors $Q_8$ and $Q_9$ forming the current mirror circuit CM.

Since the forward-biased diodes $Q_{10}$ serving as the second level shifting circuit $LS_2$ is connected between the current mirror circuit CM and the base of the output transistor $Q_3$, the maximum output voltage $v_{o(max)}$ of the output voltage $v_o$ is given by the following formula:

$$v_{o(max)} = V_{CC} - V_{BEQ8} + V_{BEQ10} - V_{BEQ3} \quad (6)$$

$$\approx V_{CC} - V_{BE}$$

where $V_{CC}$ is the power supply voltage and $V_{BEQ8}$, $V_{BEQ10}$ and $V_{BEQ3}$ are base-emitter voltages of the transistors $Q_8$, $Q_{10}$ and $Q_3$, respectively.

Accordingly, by the arrangement of the second level shifting circuit $LS_2$, the maximum output voltage $v_{o(max)}$ of the push-pull output circuit of the present embodiment has a relatively small residual voltage $V_{BE}$ although it does not use the bootstrap capacitor.

Should the opposite ends of the second level shifting circuit $LS_2$ be shorted, the maximum output voltage $v'_{o(max)}$ would have a relatively large residual voltage of $2\,V_{BE}$ as is given by the following formula:

$$v'_{o(max)} = V_{CC} - V_{BEQ8} - V_{BEQ3} \quad (7)$$

$$\approx V_{CC} - 2V_{BE}$$

It is seen from the above consideration that by the arrangement of the second level shifting circuit $LS_2$ the maximum output voltage $v_{o(max)}$ can assume a high voltage close to the power supply voltage $V_{CC}$ without using the bootstrap capacitor.

A constant current circuit $I_{01}$ in the collector circuit of the amplifying transistor $Q_5$ serves as a collector load for the amplifying transistor $Q_5$.

In the circuit of the present embodiment, the distortion factor of the open loop characteristic can be readily improved because the driving transistor $Q_1$ of the inverted Darlington-connected transistors $Q_1$ and $Q_3$ for producing the positive half cycle output essentially acts as a driving transistor so that the transistors $Q_1$ and $Q_3$ are analogous with the inverted Darlington-connected transistors $Q_2$ and $Q_4$ for producing the negative half cycle output.

The gain $(v_o/v_i)up$ when the positive half cycle output transistor $Q_3$ is conductive is given by the following formula:

$$(v_o/v_i)_{up} = h_{feQ1} \cdot h_{feQ3} \cdot S_{EQ8} \cdot R_L / h_{ibQ5} \cdot S_{EQ9} \quad (8)$$

where $h_{feQ1}$ is the current amplification factor of the transistor $Q_1$, $h_{feQ3}$ is the current amplification factor of the transistor $Q_3$, $S_{EQ8}$ is an emitter area of the transistor $Q_8$, $R_L$ is the resistance of a speaker load $R_L$, $h_{ibQ5}$ is the common-base input impedance of the transistor $Q_5$ and $S_{EQ9}$ is an emitter area of the transistor $Q_9$.

On the other hand, the gain $(v_o/v_i)_{DW}$ for the negative half cycle output is given by the previously mentioned formula (5), which is again shown below:

$$(v_o/v_i)_{DW} = h_{feQ2} \cdot h_{feQ4} \cdot R_L / h_{ibQ5} \quad (9)$$

where $h_{feQ2}$ is the current amplification factor of the transistor $Q_2$ and $h_{feQ4}$ is the current amplification factor of the transistor $Q_4$.

In the above formula (8), when the gain of the current mirror circuit is unity ($S_{EQ8} = S_{EQ9}$) and the PNP transistors $Q_1$ and $Q_2$ and the NPN transistors $Q_3$ and $Q_4$ manufactured by the same process condition are used, the current amplification factors of the transistors in each pair are approximately equal ($h_{feQ1} = h_{feQ2}$, $h_{feQ3} = h_{feQ4}$) the dispersion of the device characteristics is cancelled out. As a result, it is possible to attain the equal gains $(v_o/v_i)up = (v_o/v_i)_{DW}$ to prevent the generation of the second harmonics and hence to improve the distortion factor of the open loop characteristics.

Accordingly, when the present circuit is constructed in a negative feedback configuration, the distortion factor is not considerably deteriorated even if the amount of feedback decreases in the high frequency region.

When the present circuit is constructed in the monolithic integrated circuit structure, the gains can be readily matched by setting the gain of the current mirror circuit CM to unity (that is, $S_{EQ8} = S_{EQ9}$) and using the same structure for the PNP transistors $Q_1$ and $Q_2$ and for the NPN transistors $Q_3$ and $Q_4$.

When the present circuit is constructed by discrete devices, matching of the gain can be attained by selecting the devices of the same characteristic. In this case, a cost reduction can be attained because the matching of the gains in the prior art circuit includes a high cost in selecting the devices of desired characteristics.

The present invention is not limited to the preferred embodiment shown in FIG. 1 but resistor means may be additionally provided to prevent the oscillation or stabilize an idling current. The constant current circuit inserted in the common emitter circuit of the current mirror circuit may be a mere current path circuit, but when the constant current circuit is used a negative feedback is given by the current flowing through the biasing transistor $Q_{10}$ to further stabilize the bias.

The conductivity types of the transistors may be reversed.

Figure 3:
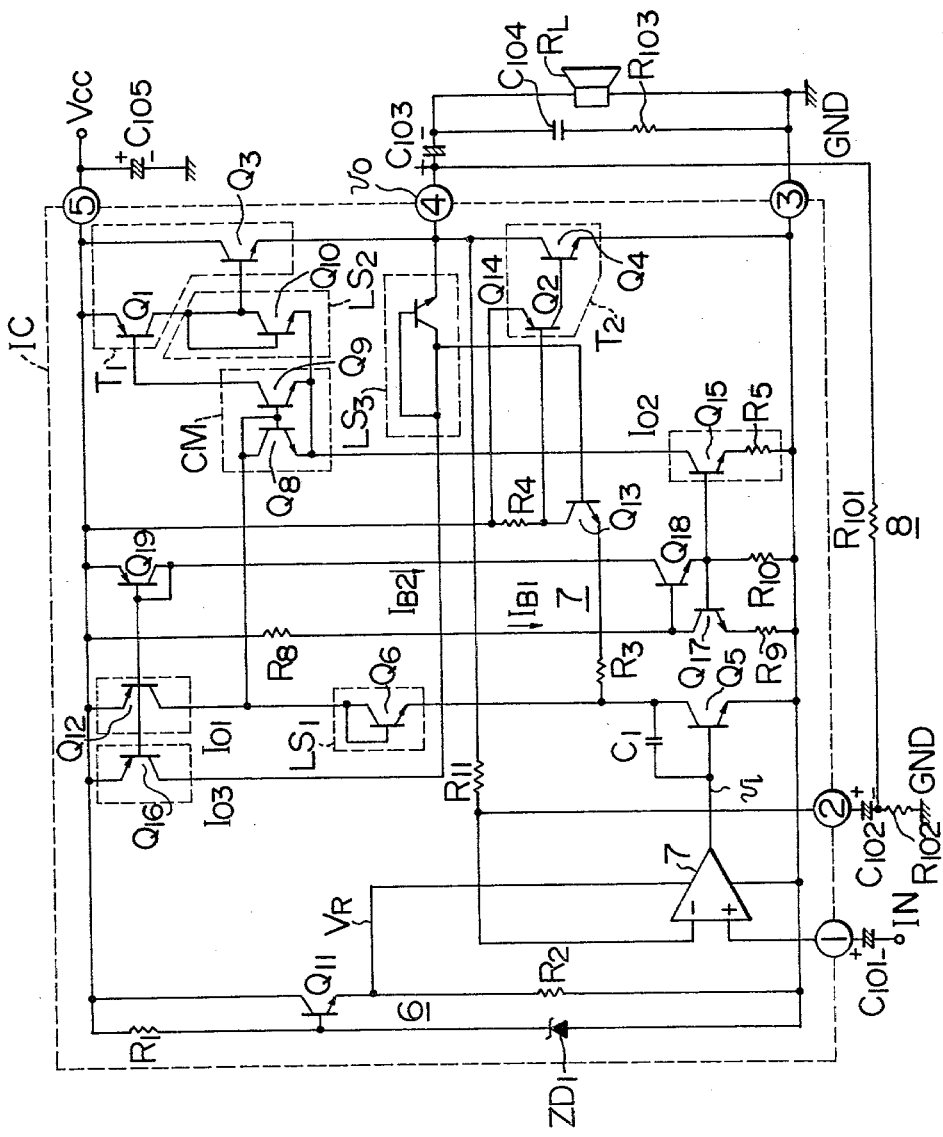
FIG. 3 shows a circuit diagram of another embodiment of the present invention.

FIG. 3 shows a circuit diagram of another embodiment of the present invention. The components in a square shown by broken lines are formed on a single silicon chip by a manufacturing process well known in the art. Numerals in the circles indicate lead terminals of the monolithic integrated circuit. All of the NPN transistors in the monolithic integrated circuit shown by the broken line square are formed in vertical transistor structure while all of the PNP transistors are formed in lateral transistor structure.

An NPN transistor $Q_{11}$, a zener diode $ZD_1$ and resistors $R_1$ and $R_2$ constitute a constant voltage regulator 6 which supplies to a preamplifier 7 a substantially constant operating voltage $V_R$ which is practically independent of the magnitude of the power supply voltage $V_{CC}$.

Applied to an input terminal (+) of the preamplifier 7, through an input coupling capacitor $C_{101}$, is an input signal IN, and an output $v_i$ from the preamplifier 7 drives the base of a class A amplifying transistor $Q_5$.

Connected across the collector and the base of the class A amplifying transistor $Q_5$ is a phase compensating capacitor $C_1$. The collector of the class A amplifying transistor $Q_5$ is connected to an NPN transistor $Q_{12}$ of a constant current circuit $I_{01}$ through an NPN transistor $Q_6$ of a first level shifting circuit $LS_1$ for reducing crossover distortion.

The push-pull output circuit essentially consists of a first transistor group $T_1$ and a second transistor group $T_2$. The first transistor group $T_1$ is arranged between the power supply voltage $V_{CC}$ (terminal 5) and an output terminal (terminal 4) and comprises PNP transistor $Q_1$ and NPN transistor $Q_3$ which are connected in an inverted Darlington configuration. A portion of the second transistor group $T_2$ is arranged between the output terminal (terminal 4) and a ground terminal (terminal 3) and it comprises PNP transistor $Q_2$ and NPN transistor $Q_4$ which are connected in an inverted Darlington configuration. The emitter of the PNP transistor $Q_2$ is connected to the power supply terminal.

Applied to the base of the PNP transistor $Q_2$, through an oscillation preventing resistor $R_3$ and an emitter-collector path of an NPN transistor $Q_{13}$, is the collector output of the class A amplifying transistor $Q_5$. Since the base of the NPN transistor $Q_{13}$ is connected to the output terminal through a collector-emitter path of an NPN transistor $Q_{14}$ of a third level shifting circuit $LS_3$, the NPN transistor $Q_{13}$ essentially acts as a common-base transistor. The collector of the common-base transistor $Q_{13}$ is connected to the power supply terminal through a load resistor $R_4$. Accordingly, the base-emitter junction of the PNP transistor $Q_2$ is driven by a voltage drop across the load resistor $R_4$ by a collector signal current of the common-base transistor $Q_3$.

On the other hand, the collector output of the class A amplifying transistor $Q_5$ is applied to the current mirror circuit CM through the first level shifting circuit $LS_1$. The current mirror circuit CM comprises NPN transistors $Q_8$ and $Q_9$ having the same emitter areas $S_{EQ8}$ and $S_{EQ9}$. Thus, the gain of the current mirror circuit CM (i.e. the ratio of the collector currents of the transistors $Q_8$ and $Q_9$) is equal to 1 (unity). The commonly connected emitters of the NPN transistors $Q_8$ and $Q_9$ of the current mirror circuit CM are connected to a constant current circuit $I_{O2}$ which comprises an NPN transistor $Q_{15}$ and a resistor $R_5$.

A second level shifting circuit $LS_2$ is connected between the commonly connected emitters of the NPN transistors $Q_8$ and $Q_9$ of the current mirror circuit CM and the base of the NPN transistor $Q_3$ of the first transistor group $T_1$. The second level shifting circuit $LS_2$ comprises an NPN transistor $Q_{10}$. As in the case of the embodiment shown in FIG. 1, by the arrangement of the second level shifting circuit $LS_2$, a high maximum output voltage $v_{o(max)}$ close to the power supply voltage $V_{CC}$ can be obtained.

In order to render a minimum output voltage $v_{o(min)}$ of the output voltage $v_o$ obtainable from the output terminal (terminal 4) to assume a low voltage close to the ground level, a third level shifting circuit $LS_3$ is arranged between the output terminal (terminal 4) and the base of the NPN transistor $Q_{13}$. The third level shifting circuit $LS_3$ comprises an NPN transistor $Q_{14}$. The collector of the NPN transistor $Q_{14}$ is connected to the base of the NPN transistor $Q_{13}$ and to its own base. A current flowing into the third level shifting circuit $LS_3$ is supplied from a collector of a PNP transistor $Q_{16}$ which forms a constant current circuit $I_{O3}$.

Accordingly, the minimum output voltage $v_{o(min)}$ of the output voltage $v_o$ obtainable at the output terminal is given by the following formula:

$$v_{o(min)} \simeq V_{CE(sat)Q5} + V_{BEQ13} - V_{BEQ14} \qquad (10)$$

where $V_{CE(sat)Q5}$ is the collector-emitter saturation voltage of the transistor $Q_5$, $V_{BEQ13}$ is the base-emitter voltage of the transistor $Q_{13}$, and $V_{BEQ14}$ is the base-emitter voltage of the transistor $Q_{14}$. By selecting the transistors $Q_{13}$ and $Q_{14}$ of the same device characteristic (particularly the emitter size), the base-emitter voltages $V_{BEQ13}$ and $V_{BEQ14}$ can be made equal. Under this condition, the above formula (10) can be modified as shown below;

$$v_{o(min)} \simeq V_{CE(sat)Q5} \qquad (11)$$

On the other hand, the magnitudes of the currents flowing through the first, second and third constant current circuits $I_{O1}$, $I_{O2}$ and $I_{O3}$ depend on a first biasing current $I_{B1}$ flowing through a biasing circuit 7 which comprises resistors $R_8$, $R_9$ and $R_{10}$, NPN transistors $Q_{17}$ and $Q_{18}$ and a PNP transistor $Q_{19}$. The first biasing current $I_{B1}$ is given by the following formula:

$$I_{B1} = \frac{V_{CC} - V_{BEQ18} - V_{BEQ17}}{R_8 + R_9} \qquad (12)$$

The magnitude of a second biasing current $I_{B2}$ flowing through the emitter-collector path of the PNP transistor $Q_{19}$ and the collector-emitter path of the NPN transistor $Q_{18}$ is given by the following formula:

$$I_{B2} = \frac{V_{BEQ17} + R_9 \cdot I_{B1}}{R_{10}} \qquad (13)$$

The magnitudes of the constant currents $I_{CQ12}$ and $I_{CQ16}$ flowing through the constant current circuits $I_{O1}$ and $I_{O2}$ can be selected to any desired values by appropriately selecting the emitter sizes of the PNP transistors $Q_{19}$, $Q_{12}$ and $Q_{16}$. On the other hand, the magnitude of the constant current $I_{EQ15}$ flowing through the constant current circuit $I_{O2}$ is given by the following formula:

$$I_{EQ15} = \frac{V_{BEQ17} - V_{BEQ15} + R_9 \cdot I_{B1}}{R_5} \approx \frac{R_9}{R_5} \cdot I_{B1} \qquad (14)$$

On the other hand, the emitter current $I_{EQ13}$ of the transistor $Q_{13}$ is given by the following formula:

$$I_{EQ13} = \frac{V_{BEQ2}}{R_4} \qquad (15)$$

Accordingly, by appropriately selecting the magnitudes of the constant currents $I_{EQ13}$ and $I_{CQ16}$, the minimum output voltage $v_{o(min)}$ of desired magnitude can be obtained in accordance with the above formula (11).

In accordance with the present embodiment, the emitter sizes $S_{EQ8}$ and $S_{EQ9}$ of the NPN transistors $Q_8$ and $Q_9$ of the current mirror circuit CM are equal. The lateral PNP transistor $Q_1$ of the first transistor group $T_1$ and the lateral PNP transistor $Q_2$ of the second transistor group have the emitter areas $S_{EQ1}$ and $S_{EQ2}$ which are forty times as large as the emitter areas of the other small signal lateral PNP transistors (e.g. transistor $Q_{19}$), and have the equal current amplification factors $h_{fe1}$ and $h_{fe2}$. The vertical NPN transistor $Q_3$ of the first transistor group $T_1$ and the vertical NPN transistor $Q_4$ of the second transistor group have the emitter areas $S_{EQ3}$ and $S_{EQ4}$ which are 280 times as large as the emitter sizes of the other small signal vertical NPN transistors (e.g. transistor $Q_{18}$), and have the equal current amplification factors $h_{fe3}$ and $h_{fe4}$.

In accordance with the embodiment shown in FIG. 3, as in the case of the embodiment shown in FIG. 1, a high maximum output voltage is obtainable without using the bootstrap capacitor and the distortion factor in the open loop characteristic can be reduced and a low minimum output voltage is obtainable.

In the embodiment shown in FIG. 3, a negative feedback resistor $R_{11}$ is connected between the output terminal and a negative feedback terminal (−) of the preamplifier 7, and a negative feedback circuit 8 comprising resistors $R_{101}$ and $R_{102}$, and a capacitor $C_{102}$ is connected between the terminal 4 and the terminal 2. The output voltage $v_o$ of the push-pull output circuit is applied to the speaker load $R_L$ through an output coupling capacitor $C_{103}$. A capacitor $C_{104}$ and a resistor $R_{103}$ is connected in series across the speaker load $R_L$ to prevent the oscillation.

What is claimed is:

1. A push-pull output circuit comprising:
   (a) a first transistor group having at least a portion thereof connected between a first operating potential point and an output terminal and including first transistor of a first conductivity type and second transistor of a second conductivity type which are connected in inverted Darlington configuration;
   (b) a second transistor group having at least a portion thereof connected between said output terminal and a second operating potential point and including third transistor of said first conductivity type and fourth transistor of said second conductivity type which are connected in inverted Darlington configuration, the base of said third transistor receiving an input signal;
   (c) a first level shifting circuit having one terminal thereof connected to receive said input signal;
   (d) a current mirror circuit including two transistors of said second conductivity type, the emitters of said two transistors being connected together, the input terminal and the output terminal of said current mirror circuit being connected to another terminal of said first level shifting circuit and the base of said first transistor of said first transistor group, respectively; and
   (e) a second level shifting circuit connected between the commonly connected emitters of said two transistors of said current mirror circuit and the base of said second transistor of said first transistor group.

2. A push-pull output circuit according to claim 1, wherein said first and third transistors of said first conductivity type are PNP transistors, and said second and fourth transistors of said second conductivity type are NPN transistors.

3. A push-pull output circuit according to claim 2, wherein said PNP transistors and said NPN transistors are constructed in lateral transistor structure and vertical transistor structure, respectively, of a monolithic semiconductor integrated circuit.

4. A push-pull output circuit according to claim 1 further comprising (f) a fifth transistor of said second conductivity type, (g) means for applying said input signal to the base of said third transistor through the emitter-collector path of said fifth transistor, and (h) a third level shifting circuit connected between said output terminal and the base of said fifth transistor.

5. A push-pull output circuit according to claim 4, wherein said means for applying said input signal to the base of said third transistor comprises a class A amplifying transistor having the collector thereof connected to said one terminal of said first level shifting circuit and to the emitter of said fifth transistor, and further comprising (i) a first constant current circuit connected between said other terminal of said first level shifting circuit and said first operating voltage point for acting as a load to said class A amplifying transistor, (j) a second constant current circuit connected between the commonly connected emitters of said two transistors of said current mirror circuit and said second operating potential point, and (k) a third constant current circuit connected between said first operating potential point and said third level shifting circuit.

6. A push-pull output circuit according to claim 5 further comprising (l) a preamplifier having an input terminal, a negative feedback terminal and an output terminal for driving the base of said class A amplifying transistor, (m) a negative feedback network arranged between said output terminal of said push-pull output circuit and said negative feedback terminal of said preamplifier, (n) an output coupling capacitor having one terminal thereof connected to said output terminal of said push-pull output circuit, (o) a speaker load connected between the other terminal of said output coupling capacitor and said second operating potential point, and (p) an oscillation preventing network connected across said speaker load.

7. A push-pull output circuit according to claims 1, 2, 3, 4, 5 or 6, wherein the emitter sizes of said two transistors of said current mirror circuit are substantially equal, the current amplification factors of said first and said third transistors are substantially equal, and the current amplification factors of said second and said fourth transistors are substantially equal.

* * * * *